United States Patent
Kawaoka et al.

(10) Patent No.: US 9,462,716 B2
(45) Date of Patent: Oct. 4, 2016

(54) SHOCK BUFFERING STRUCTURE OF ELECTRONIC DEVICE, AND ELECTRONIC DEVICE

(71) Applicant: CASIO COMPUTER CO., LTD., Shibuya-ku, Tokyo (JP)

(72) Inventors: Hiroyasu Kawaoka, Fussa (JP); Naohiko Sakurazawa, Akishima (JP); Masato Ueno, Tama (JP)

(73) Assignee: CASIO COMPUTER CO., LTD., Tokyo (JP)

( * ) Notice: Subject to any disclaimer, the term of this patent is extended or adjusted under 35 U.S.C. 154(b) by 708 days.

(21) Appl. No.: 13/752,950

(22) Filed: Jan. 29, 2013

(65) Prior Publication Data
US 2013/0215560 A1    Aug. 22, 2013

(30) Foreign Application Priority Data
Feb. 17, 2012   (JP) .................................. 2012-032736

(51) Int. Cl.
G04B 43/00     (2006.01)
H05K 7/00      (2006.01)
G04G 17/08     (2006.01)

(52) U.S. Cl.
CPC ............... H05K 7/00 (2013.01); G04B 43/002 (2013.01); G04G 17/08 (2013.01)

(58) Field of Classification Search
CPC ...... G04G 17/08; G04B 3/002; G04B 37/04; G04B 37/0418
USPC ................................................ 267/153, 140
See application file for complete search history.

(56) References Cited

U.S. PATENT DOCUMENTS

| | | | | |
|---|---|---|---|---|
| 5,442,602 A * | 8/1995 | Hirai | ..................... | G04B 37/005 368/286 |
| 5,853,844 A * | 12/1998 | Wen | ..................... | A43B 13/181 36/114 |
| 6,009,578 A * | 1/2000 | Davis | ..................... | A47C 7/021 297/219.1 |
| 7,254,852 B2 * | 8/2007 | Martin | ..................... | A47G 9/10 5/636 |
| 7,431,495 B2 * | 10/2008 | Cretin | ................... | G04B 37/055 368/287 |

(Continued)

FOREIGN PATENT DOCUMENTS

CN        102117043 A     7/2011
JP        2000208955 A    7/2000

(Continued)

OTHER PUBLICATIONS

Chinese Office Action (and English translation thereof) dated Feb. 28, 2015, issued in counterpart Chinese Application No. 201310051380.7.

(Continued)

*Primary Examiner* — Sean Kayes
(74) *Attorney, Agent, or Firm* — Holtz, Holtz & Volek PC (57) ABSTRACT

A shock buffering structure which has a side buffer member arranged between a wristwatch case and a watch module within the wristwatch case, wherein the side buffer member is layered and formed by a plurality of buffer layers having respectively different vibration transmissibility for predetermined frequencies. Accordingly, when the wristwatch case receives vibration from external shock, the plurality of buffer layers of the side buffer member attenuate and absorb low-frequency vibration and high-frequency vibration, respectively.

10 Claims, 7 Drawing Sheets

(56) References Cited

U.S. PATENT DOCUMENTS

| | | | |
|---|---|---|---|
| 7,708,457 B2* | 5/2010 | Girardin | G04B 37/0058 368/287 |
| 8,328,416 B2 | 12/2012 | Behling et al. | |
| 8,500,325 B2* | 8/2013 | Ueno | G04B 37/052 368/287 |
| 8,708,552 B2 | 4/2014 | Ueno | |
| 8,777,191 B2* | 7/2014 | Kligerman | F16F 1/373 188/371 |
| 2011/0019508 A1 | 1/2011 | Behling et al. | |
| 2011/0096481 A1 | 4/2011 | Ueno | |
| 2012/0176871 A1* | 7/2012 | Ueno | G04B 37/052 368/287 |

FOREIGN PATENT DOCUMENTS

| | | |
|---|---|---|
| JP | 2011027736 A | 2/2011 |
| JP | 2011040025 A | 2/2011 |
| JP | 2011-095025 A | 5/2011 |

OTHER PUBLICATIONS

Zheng, et al., "Physical Properties of Materials", p. 249, TianJin University Press, Feb. 2008.

Japanese Office Action (and English translation thereof) dated Aug. 17, 2015, issued in counterpart Japanese Application No. 2013-000961.

* cited by examiner

SHOCK BUFFERING STRUCTURE OF ELECTRONIC DEVICE, AND ELECTRONIC DEVICE

CROSS-REFERENCE TO RELATED APPLICATION

This application is based upon and claims the benefit of priority from the prior Japanese Patent Application No. 2012-032736, filed Feb. 17, 2012, the entire contents of which is incorporated herein by reference.

BACKGROUND OF THE INVENTION

1. Field of the Invention

The present invention relates to a shock buffering structure used in an electronic device such as a wristwatch, a mobile phone, and a mobile information processing terminal, and an electronic device having this shock buffering structure.

2. Description of the Related Art

A shock buffering structure for wristwatches is known in which a plurality of buffer members are arranged between a wristwatch case and a watch module housed in the wristwatch case so as to protect the watch module by absorbing external shock, as described in Japanese Patent Application Laid-open (Kokai) Publication No. 2011-095025.

This type of shock buffering structure includes a first buffer member and a second buffer member. When the wristwatch case receives external shock, the first buffer member absorbs the shock by being elastically deformed. The second buffer member, which is arranged in areas other than that of the first buffer member, receives the shock before the first buffer member, and absorbs the shock such that the shock is dispersed by its volume being changed in response to the impact force.

However, in this shock buffering structure, the first buffer member and the second buffer member are formed separately and arranged in different areas between the wristwatch case and the watch module. As a result, vibration from external shock received by the wristwatch case is absorbed by each of the first and second buffer members independently. Accordingly, there is a problem in that vibration from shock cannot be efficiently absorbed.

SUMMARY OF THE INVENTION

An object of the present invention is to provide a shock buffering structure of an electronic device in which vibration from external shock and the like is efficiently and favorably absorbed, and an electronic device having this shock buffering structure.

In order to achieve the above-described object, accordance with one aspect of the present invention, there is provided a shock buffering structure comprising: a buffer member which is arranged between a device case and a module arranged within the device case, wherein the buffer member is layered and formed by a plurality of buffer layers having respectively different vibration transmissibility for predetermined frequencies.

In accordance with another aspect of the present invention, there is provided an electronic device comprising a device case a module which is arranged within the device case; and a buffer member which is interposed between the device case and the module that absorbs shock, wherein the buffer member is layered and formed by a plurality of buffer layers having respectively different vibration transmissibility for predetermined frequencies.

The above and further objects and novel features of the present invention will more fully appear from the following detailed description when the same is read in conjunction with the accompanying drawings. It is to be expressly understood, however, that the drawings are for the purpose of illustration only and are not intended as a definition of the limits of the invention.

DETAILED DESCRIPTION OF THE PREFERRED EMBODIMENTS

An embodiment in which the present invention has been applied to a pointer type wristwatch will hereinafter be described with reference to FIG. 1 to FIG. 5.

Figure 1:
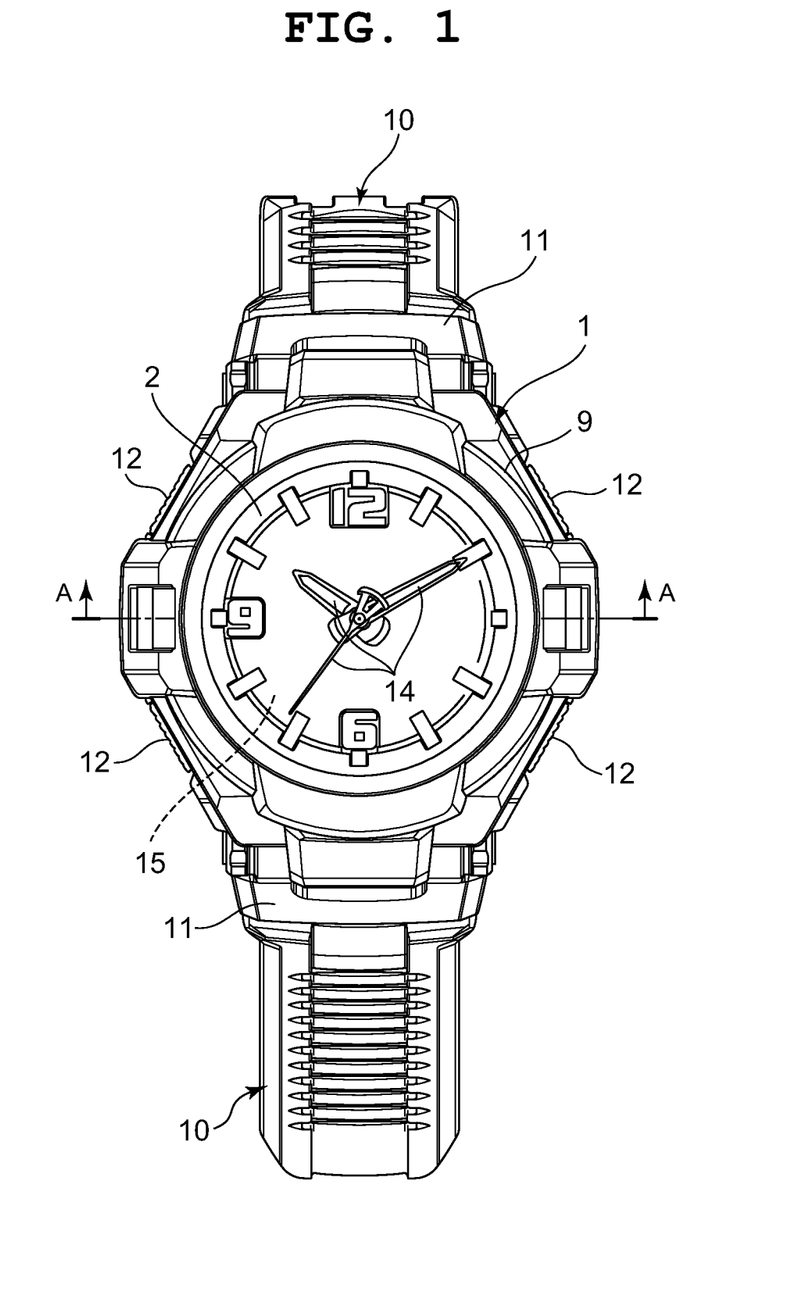
FIG. 1 is an enlarged front view of an embodiment in which the present invention has been applied to a wristwatch.
Figure 2:
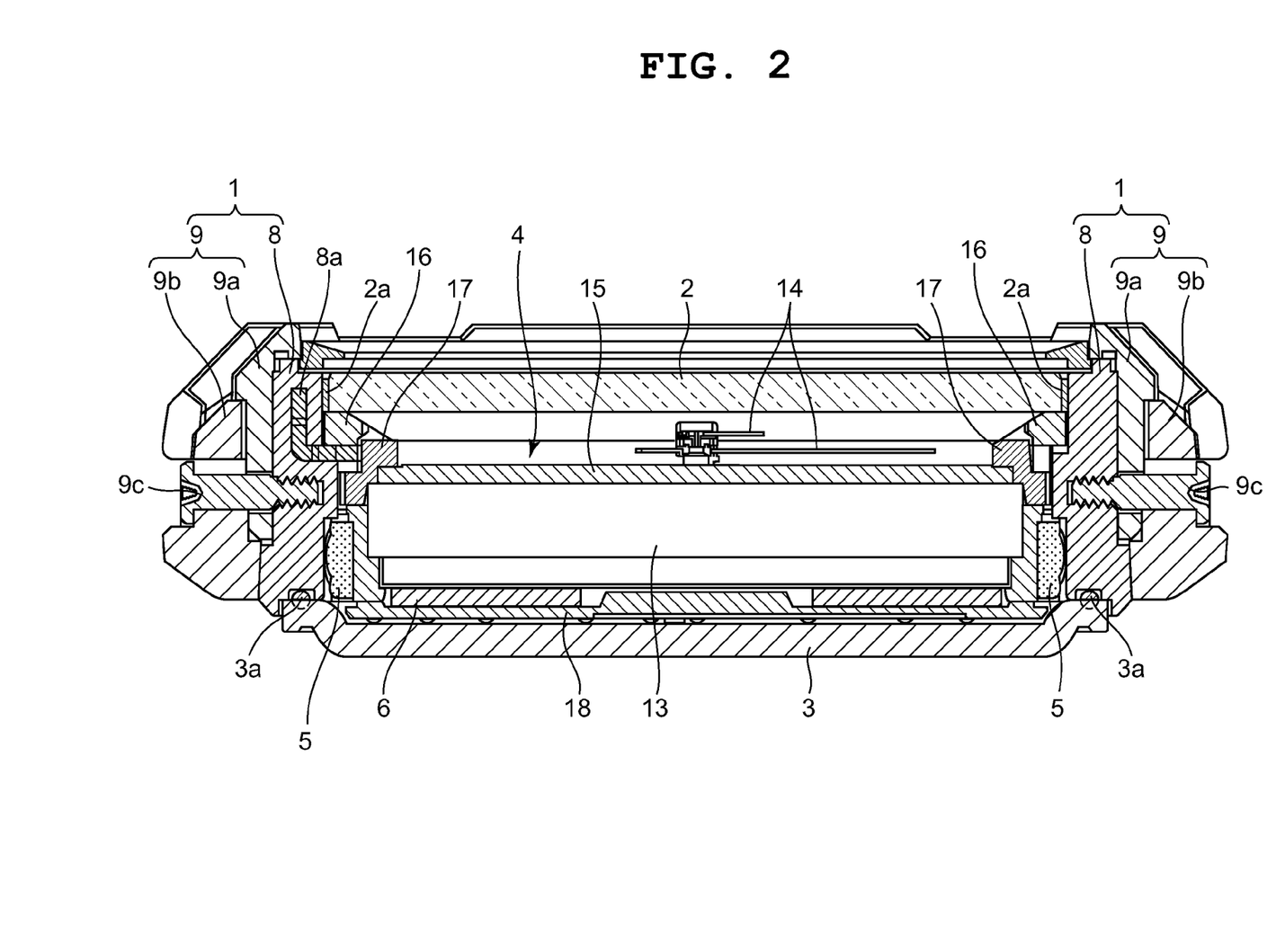
FIG. 2 is an enlarged cross-sectional view of the main section of the wristwatch taken along line A-A in FIG. 1.

As shown in FIG. 1 and FIG. 2, this wristwatch includes a wristwatch case 1.

The top opening portion of the wristwatch case 1 has a watch crystal 2 mounted therein via a gasket 2a, and the underside of the wristwatch case 1 has a back. cover 3 attached thereto via a waterproof ring 3a.

Figure 3:
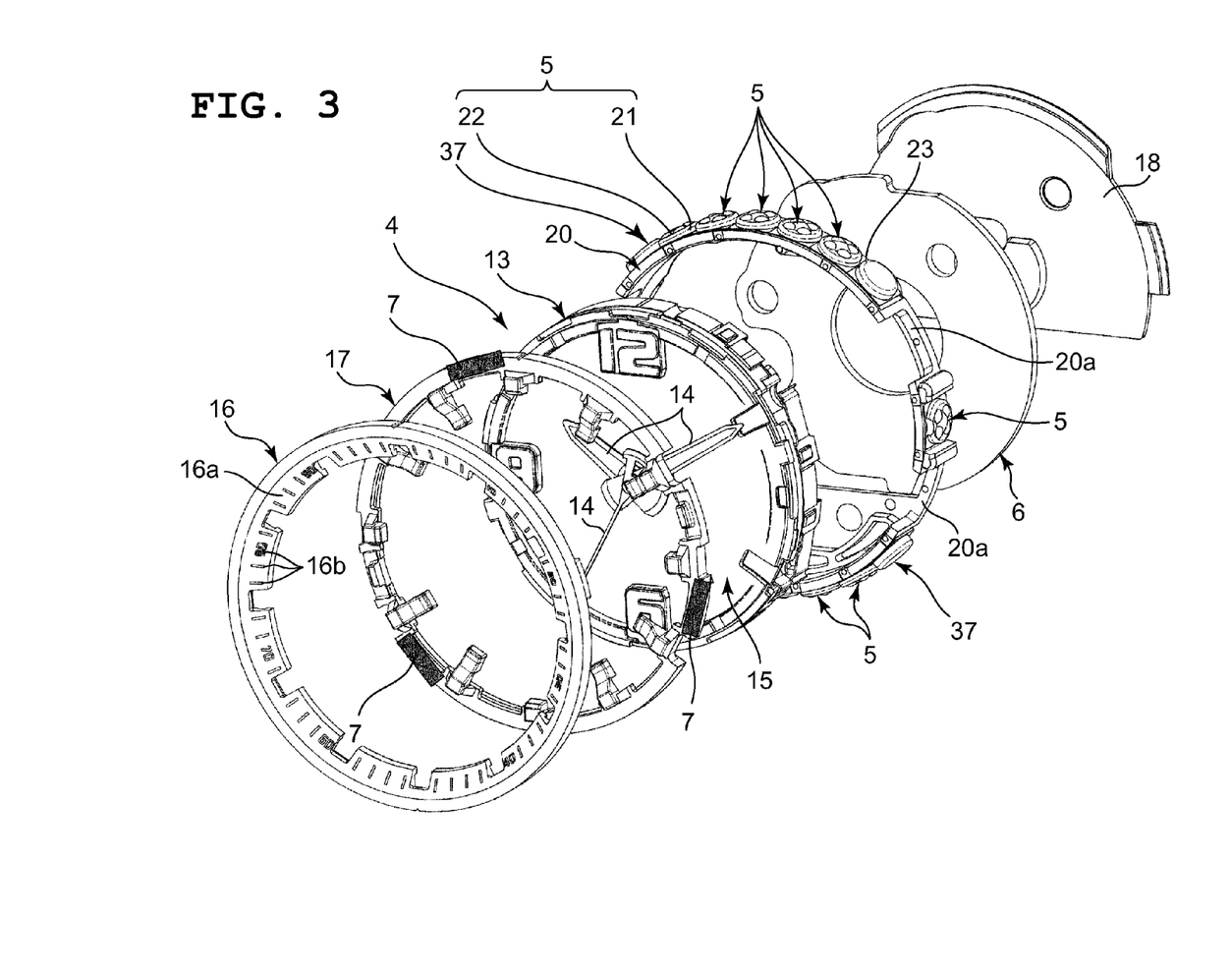
FIG. 3 is an exploded perspective view of the main section, in which the watch module and various buffer members in the wristwatch case of FIG. 2 have been enlarged and shown.

Within the wristwatch case, a watch module 4 is arranged via plural types of buffer members 5 to 7, as shown in FIG. 2 and FIG. 3.

The wristwatch case 1 includes a case body 8 composed of a hard synthetic resin, and a two-layer structure bezel 9 provided on the outer peripheral surface of the case body 8, as shown in FIG. 1 and FIG. 2.

In the case body 8, a metal reinforcement member 8*a* is provided projecting inwards from the inner upper portion, by insert molding, as shown in FIG. 2.

The bezel 9 is constituted by a lower bezel 9*a* and an upper bezel 9*b*. The lower bezel 9*a* is composed of a soft synthetic resin and provided on the outer peripheral surface of the case body 8. The upper bezel 9*b* is composed of a soft synthetic resin that is slightly harder than that of the lower bezel 9*a*, and provided on the outer front surface of the lower bezel 9*a*.

These lower and upper bezels 9*a* and 9*b* are attached to the case body 8 by a screw 9*c*.

Also, the 12 o' clock side and the 6 o' clock side of the wristwatch case 1 are respectively provided with a band attaching section 11 for attaching a watch band 10, as shown in FIGS. 1 In addition, the 3 o' clock side and the 9 o' clock side of the wristwatch case 1 are respectively provided with two push-button switches 12.

The watch module 4 includes a housing 13 composed of a hard synthetic resin, as shown in FIG. 2 and FIG. 3.

Within the housing 13, various electronic components (not shown) required for a clock function, such as a watch movement for moving hands 14, are provided.

In addition, a dial 15 is arranged on the top surface of the housing 13.

On the peripheral edge portion of this dial 15, a partition member 16 is arranged via a spacer member 17.

The partition member 16 is composed of a hard synthetic resin and has an entire ring shape, as shown in FIG. 3.

In this instance, the inner peripheral surface of the partition member 16 is formed in a sloped surface 16*a*, and scale markings 16*b* such as time markings are drawn thereon.

The spacer member 17 is also composed of a hard synthetic resin and has a ring shape as a whole, as in the case of the partition member 16.

On the spacer member 17, a plurality of upper buffer members 7 are provided.

The upper buffer members 7 are composed of an elastic material such as rubber or an elastomer, and provided in predetermined areas of the spacer member 17, such as in three areas of 12 o'clock, 4 o'clock, and 8 o'clock, as shown in FIG. 3.

In this case, the upper buffer members 7 may be provided only on the top surface of the spacer member 17.

Alternatively, the upper buffer members 7 may be provided on both the top surface and the bottom surface of the spacer member 17.

Further, the upper buffer members 7 may be extended and provided from the top surface to the bottom surface of the spacer member 17 through the side surface.

Also, in the present embodiment as shown in FIG. 3, although the upper buffer members 7 are arranged slightly projected from the top surface among the surfaces of the spacer member 17, for example, the top surface, the bottom surface and the side surface, the upper buffer members 7 may be arranged slightly projected from the bottom surface and the side surface.

As a result of these structures, when the watch crystal 2 of the wristwatch case 1 receives shock from above, the upper buffer members 17 absorb the shock.

On the underside of the housing 13 of the watch module 4, a lower buffer member 6 is arranged via a pressing plate 18 such that it is pressed into the wristwatch case 1 by the back cover 3, as shown in. FIG. 2 and FIG. 3.

In this instance, the lower buffer member 6 is composed of an elastic material such as rubber or an elastomer, or preferably silicone gel, and is formed in a flat plate shape.

This lower buffer member 6 is arranged on the bottom surface of the housing 13. Accordingly, when the back cover 3 receives shock from the lower side in this state, the shock is absorbed.

On the outer peripheral surface of the housing 13, a pressing ring 20 is arranged as shown in FIG. 2 and FIG. 3, and the side buffer members 5 and push-button switch receiving members 37 are arranged side-by-side on the outer peripheral surface of this pressing ring 20.

The pressing ring 20, which is composed of a hard synthetic resin such as polyacetal (POM), or metal, has a substantially cylindrical shape and arranged on the outer peripheral surface of the housing 13.

On the 3 o'clock side and the 9 o'clock side of this pressing ring 20, a plurality of notched sections 20*a* into which the button shaft portions (not shown) of the plurality of push-button switches 12 are respectively inserted are provided.

The side buffer members 5 are provided on the outer peripheral surface of the pressing ring 20 excluding the areas of the plurality of notched sections 20*a* provided in the pressing ring 20, and arranged between the inner peripheral surface of the wristwatch case 1 and the outer peripheral surface of the housing 13 of the watch module 4, together with the pressing ring 20, as shown in FIG. 3.

Figure 5A:
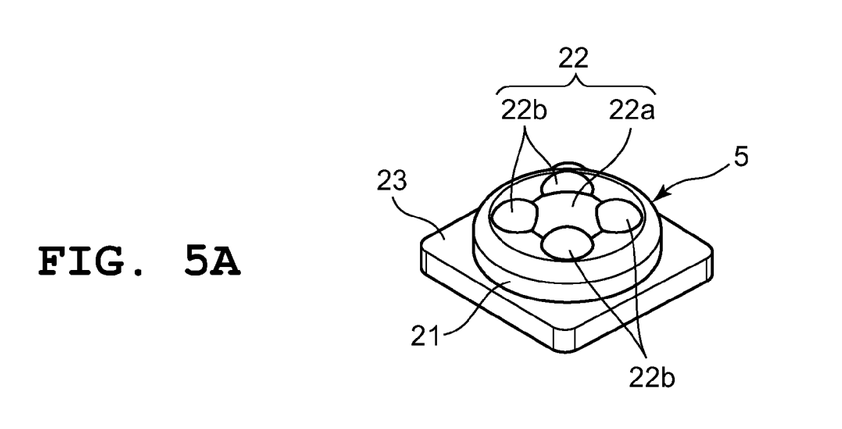
FIG. 5A is an enlarged perspective view of the main section of a side buffer member shown in FIG. 4.

The side buffer members 5 are layered and formed by a first buffer layer 21 and a second buffer layer 22 that have respectively different vibration transmissibility for predetermined frequencies.

In this instance, the first buffer layers 21 are formed having low vibration transmissibility for low frequencies, and the second buffer layers 22 are formed having low vibration transmissibility for frequencies higher than those of the first buffer layers 21.

That is, the first buffer layers 21 and the second buffer layers 22 are each composed of an elastic material such as rubber or an elastomer, or preferably silicone gel.

Figure 4:
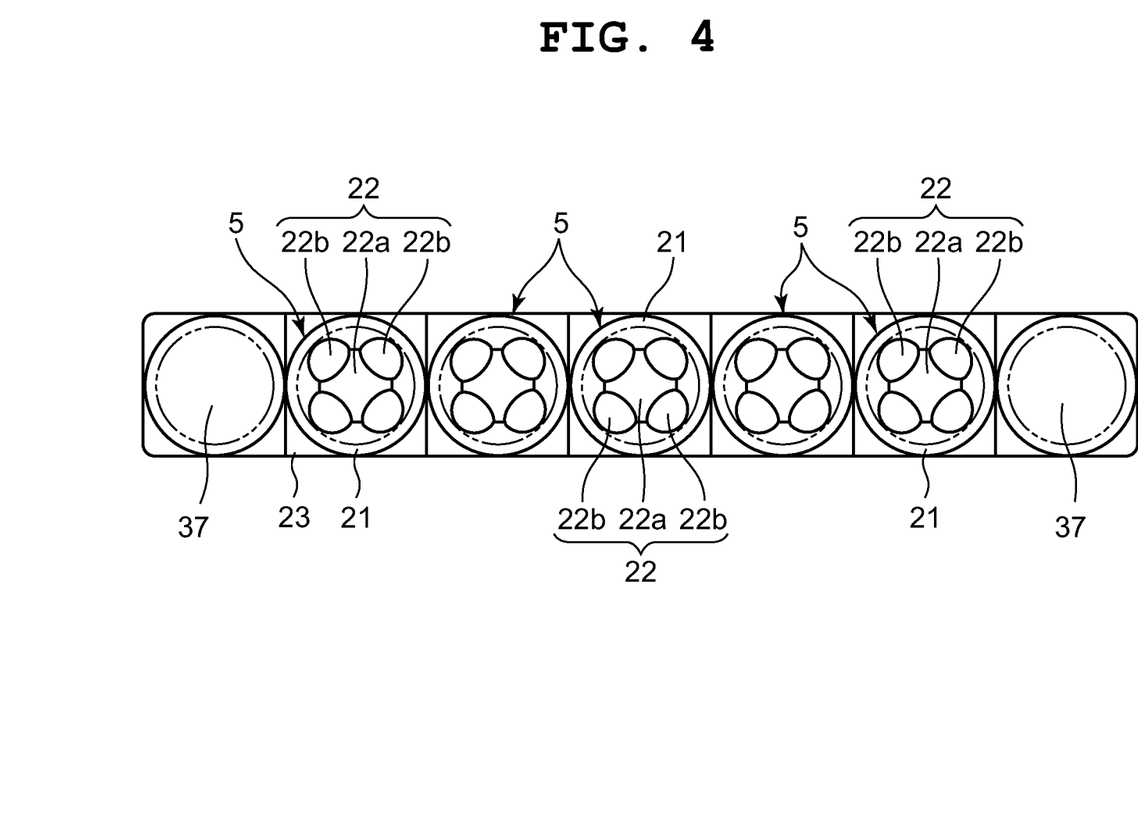
FIG. 4 is an enlarged view of side buffer members provided on the outer peripheral surface of the pressing ring shown in FIG. 3.

Also, the first buffer layers 21 are each formed in a short columnar plate shape resembling a disk shape having a predetermined thickness as shown in FIG. 4 and FIG. 5A, and the second buffer layers 22 are each formed by a first projecting section 22*a* and second projecting sections 22*b* arrayed on each first buffer layer 21.

Of the first projecting section 22*a* and the second projecting sections 22*b*, the first projecting section 22*a* has a dome shape projecting from the center of the first buffer layer 21, as shown in FIG, 4 and FIG. 5.

The second projecting sections 22*b* are formed to project from a plurality of areas, such as four areas, around the first projecting section 22*a*, and each of which has a dome shape whose size is smaller than that of the first projecting section 22*a*.

In this instance, the first projecting section 22*a* and the second projecting sections 22*b* are formed such that their projection heights are substantially the same.

In addition, the push-button switch receiving members 37 are arranged side-by-side with the side buffer members 5 and positioned on portions of the outer peripheral surface of the pressing ring 20 opposing the push-button switches 12, as shown in FIG. 3.

Figure 5B:
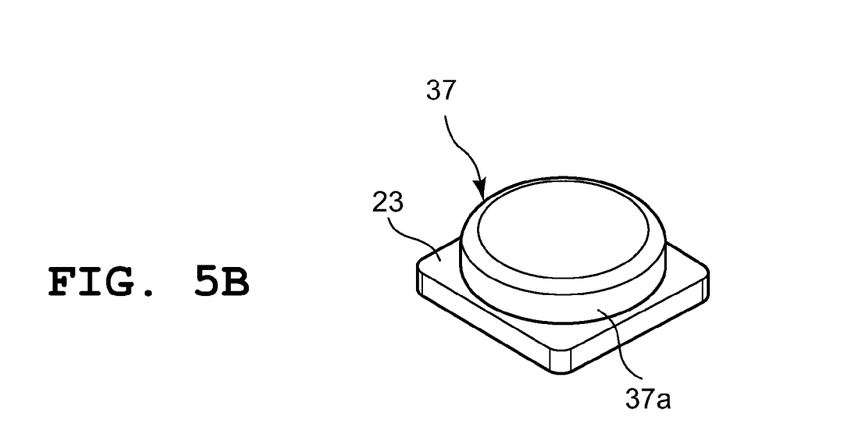
FIG. 5B is an enlarged perspective view of the main section of a push-button switch receiving member shown in FIG. 4.

Moreover, the push-button switch receiving members 37 and the pressing ring 20 are arranged together between the inner peripheral surface of the wristwatch case 1 and the outer peripheral surface of the housing 13 of the watch module 4, Furthermore, the push-button switch receiving members 37 are each formed by a first buffer layer 37a which are equal height or slightly lower height than the side buffer members 5 and have low vibration transmissibility for low frequencies, as shown in FIG. 4 and FIG. 5B.

When one of the push-button switches 12 is pressed, the corresponding push-button switch receiving member 37 holds the position of the watch module 4 relative to the inner peripheral surface of the wristwatch case 1.

The side buffer members 5 and the push-button switch receiving members 37 are provided in a row along with a continuous sheet 23, as shown in FIG. 4.

The continuous sheet 23 is composed of an elastic material such as rubber or an elastomer, or preferably silicone gel, and provided on the outer peripheral surface of the pressing ring 20.

Note that the side buffer members 5 and the push-button switch receiving members 37 may be provided separately on the continuous sheet 23, or may be formed integrally on the continuous sheet 23.

In this instance, the first buffer layers 21 of the side buffer members 5 and the first buffer layers 37a of the push-button switch receiving members 37 are provided on the continuous sheet 23, as shown in FIG. 4

As a result, the side buffer members 5 and the push-button switch receiving members 37 are arranged around the outer peripheral surface of the housing 13 via the continuous sheet 23 provided on the outer peripheral surface of the pressing ring 20, as shown in FIG. 2 and FIG. 3.

When the continuous sheet 23 is arranged within the wristwatch case 1 in this state, at least the tip portions of the first projecting section 22a and the second projecting sections 22b of the second buffer layer 22 formed on the first buffer layer 21 of each side buffer member 5 come in contact with the inner peripheral surface of the case body 8 of the wristwatch case 1.

As a result, when vibration from external shock is applied to the wristwatch case 1, the side buffer members 5 attenuate and absorb low-frequency vibration by the first buffer layers 21, and high-frequency vibration by the second buffer layers 22.

That is, by the first buffer layers 21 and the second buffer layers 22, the side buffer members 5 can absorb vibrations of various frequencies applied to the wristwatch case 1.

In this instance, the first buffer layers 21 have a disk shape, whereby force applied by vibration is dispersed rather than being concentrated in one area. Also, the first buffer layers 21 are stretched relative to vibration in the torsional direction. As a result of this structure, vibration in the torsional direction is attenuated.

Moreover, in the structure of the second buffer layers 22, the first projecting section 22a and the second projecting sections 22b have been arrayed, As a result, high-frequency vibrations (for example, 100 Hz to 300 Hz) and very high-frequency vibrations (for example, 300 Hz to 2000 Hz) can be attenuated and absorbed.

Next, the effects of the wristwatch described above will be described.

When vibration from shock is applied to the wristwatch case 1 of the wristwatch and the bezel 9 cannot completely absorb the vibration, the remaining unabsorbed vibration from the shock is efficiently absorbed by the plural types of buffer members 5 to 7 provided between the wristwatch case I and the watch module 4, whereby the watch module 4 is favorably protected.

For example, when the wristwatch case 1 receives shock vibration from the back cover 3 side, since the lower buffer member 6 has been arranged on the pressing plate 1 on the bottom surface of the housing 13 of the watch module 4, the shock vibration from the back cover 3 side is absorbed by the lower buffer member 6, whereby the watch module 4 is protected.

Also, when the wristwatch case 1 receives shock vibration from the watch crystal 2 side, since the upper buffer members 7 have been arranged on the spacer member 17 between the housing 13 of the watch module 4 and the partition member 16, the shock vibration from the watch crystal 2 side is absorbed by the upper buffer members 7, whereby the watch module 4 is protected.

Moreover, when the wristwatch case 1 receives vibration from external shock and the bezel 9 that cannot be completely absorbed, since the side buffer members 5 have been arranged on the pressing ring 20 on the outer peripheral surface of the housing 13 of the watch module 4, the shock vibration from outside of the wristwatch case 1 is absorbed by the side buffer members 5, whereby the watch module 4 is protected.

In this instance, when the shock vibration from outside of the wristwatch case 1 is low-frequency vibration, it is attenuated and absorbed by the first buffer layers 21 of the side buffer member 5.

The first buffer layers 21 are each composed of silicone gel, and have a disk shape and low transmissibility of low-frequency vibration, as described above. Therefore, they can reliably attenuate low-frequency vibration.

In addition, since the first buffer layers 21 have a disk shape, force applied by low-frequency vibration can be dispersed rather than being concentrated in one area. Moreover, the first buffer layers 21 are stretched relative to vibration in the torsional direction. As a result, low-frequency vibration can be attenuated and absorbed.

Accordingly, the first buffer layers 21 can efficiently attenuate and absorb low- frequency vibrations in various directions.

On the other hand, when the shock vibration from outside of the wristwatch case 1 is high-frequency vibration, it is attenuated and absorbed by the second buffer layers 22 of the side buffer member 5.

The second buffer layers 22 are each composed of silicone gel, and formed by the first projecting section 22a and the second projecting sections 22b to have low transmissibility of high-frequency vibration, as described above. Therefore, they can reliably attenuate high-frequency vibration.

In this instance, each of the second buffer layers 22 includes the first projecting section 22a having a dome shape projecting from the center of a first buffer layer 21, and the plurality of second projecting sections 22b which are projecting around the first projecting section 22a and each of which has a dome shape whose curvature is smaller than that of the first projecting section 22a.

Because of their dome shape whose curvature is smaller than that of the first projecting section 22a, the second projecting sections 22b have low vibration transmissibility for particularly high frequencies among the high frequencies.

As a result, when the wristwatch case 1 receives high-frequency vibration, the first projecting section 22a and the plurality of second projecting sections 22b can efficiently attenuate and absorb the high-frequency vibration.

Here, the projecting heights of the first projecting section 22a and the second projecting sections 22b are substantially the same, and the tip portions of the first projecting section 22a and the second projecting sections 22b are uniformly come in contact with the inner peripheral surface of the case body 8 of the wristwatch case 1.

Because of this structure, when the wristwatch case 1 receives high-frequency vibration, the high-frequency vibration can be efficiently attenuated and absorbed by the first projecting section 22a and the second projecting sections 22b.

As described above, in this shock buffering structure of a wristwatch, the side buffer members 5 arranged between the inner peripheral surface of the wristwatch case 1 and the outer peripheral surface of the watch module 4 arranged within the wristwatch case 1 are each formed by the plurality of buffer layers 21 and 22 which have different vibration transmissibility for predetermined frequencies being layered.

Therefore, when the wristwatch case 1 receives vibration from external shock, the vibration is favorably attenuated and absorbed.

That is, in this shock buffering structure of a wristwatch, when the wristwatch case 1 receives vibration from external shock, high-frequency vibration and low-frequency vibration are attenuated and absorbed by the plurality of buffer layers 21 and 22 of the side buffer member 5, respectively.

Accordingly, in this shock buffering structure of a wristwatch, vibration from external shock is efficiently and reliably absorbed, whereby the watch module 4 is favorably protected.

In this instance, the plurality of buffer layers 21 and 22 include the first buffer layers 21 and the second buffer layers 22. The first buffer layers 21 have low vibration transmissibility for low frequencies, and the second buffer layers 22 have low vibration transmissibility for frequencies higher than those of the first buffer layers 21.

Accordingly, the first buffer layers 21 can attenuate low-frequency vibration, and the second buffer layers 22 can attenuate high-frequency vibration. As a result of this structure, vibration is efficiently absorbed.

Specifically, since the first buffer layers 21 are composed of silicone gel and have a disk shape having a predetermined thickness, force applied by vibration is dispersed rather than being concentrated in one area. In addition, the first buffer layers 21 can be deformed and stretched in a well-balanced manner relative to vibration in the torsional direction, whereby the vibration in the torsional direction is efficiently attenuated and absorbed.

Moreover, since the second buffer layers 22 are composed of silicone gel and each of which is formed by the first projecting section 22a and second projecting sections 22b being arrayed, high-frequency vibration can be efficiently and reliably attenuated and absorbed by the first projecting section 22a and the second projecting sections 22b.

As described above, the first buffer layers 21 and the second buffer layers 22 of the side buffer members 5 are composed of the same material, or in other words, silicone gel. However, since the shapes of the first buffer layers 21 and the second buffer layers 22 are different, the vibration transmissibility of the first buffer layers 21 and that of the second buffer layers 22 are different.

As a result, low-frequency vibration is favorably attenuated and absorbed by the first buffer layers 21, and high-frequency vibration is favorably attenuated and absorbed by the second buffer layers 22.

That is, vibration is efficiently attenuated, and absorbed, whereby the watch module 4 is favorably and reliably protected.

Also, each of the second buffer layers 22 includes the first projecting section 22a having a dome shape projecting from the center of a first buffer layer 21, and the second projecting sections 22b which are projecting around the first projecting section 22a and each of which has a dome shape whose size is smaller than that of the first projecting section 22a.

As a result, when the wristwatch case 1 receives high-frequency vibration, the first projecting section 22a and the second projecting sections 22b can efficiently attenuate and absorb the high-frequency vibration.

Accordingly, the watch module 4 is more favorably and reliably protected.

Also, the first projecting section 22a and the second projecting sections 22b are formed to have substantially the same projection heights, and the tip portions of the first projecting section 22a and the second projecting sections 22b come in contact with the inner peripheral surface of the wristwatch case 1.

By this structural feature as well, when the wristwatch case receives high-frequency vibration, the high-frequency vibration can be efficiently attenuated.

That is, high-frequency vibrations (for example, 100 Hz to 300 Hz) and very high-frequency vibrations (for example, 300 Hz to 2000 Hz) can be favorably attenuated and absorbed by the second buffer layer 22.

Also, these side buffer members 5 have been provided on the continuous sheet 23 having elasticity. Accordingly, vibration from shock is absorbed also by the continuous sheet 23. In addition, because of this structure these side buffer members 5 do not need to be individually arranged when arranged between the wristwatch case 1 and the watch module 4. That is, the side buffer members 5 can be arranged between the wristwatch case 1 and the watch module 4 all together by means of the continuous sheet 23.

Therefore, the attachment of the plurality of side buffer members 5 to the watch module 4 is easy.

Also, in this structure since the plurality of side buffer members 5 are integrally formed on the continuous sheet 23, they do not need to be manufactured individually. Therefore, productivity of the plurality of side buffer members 5 and the continuous sheet 23 is higher, and they can be manufactured at lower cost.

Moreover, in this shock buffering structure for a wristwatch, the lower buffer member 6 is arranged between the bottom surface of the watch module 4 and the opposing bottom surface of the wristwatch case 1, and the upper buffer members 7 are arranged between the top surface of the watch module 4 and the watch crystal 2 of the wristwatch case 1 opposing the watch module 4.

Therefore, when the wristwatch case 1 receives shock from the up and down direction, this shock from the up/down direction of the wristwatch case 1 is favorably and reliably absorbed by the lower buffer member 6 and the upper buffer members 7.

In this instance, the lower buffer member 6 is composed of an elastic material, such as rubber or an elastomer, or preferably silicone gel. In addition, the lower buffer member 6 has a plate shape and is arranged on the bottom surface of the housing 13 of the watch module 4 by the pressing plate 18.

As a result of this structure, when the wristwatch case 1 receives shock from the back cover 3 side, this shock from the back cover 3 side is absorbed by the lower buffer member 6, and the watch, module 4 is favorably protected thereby.

Also, the upper buffer members 7 are composed of an elastic material, such as rubber or an elastomer, and arranged on the spacer member 17 between the housing 13 of the watch module 4 and the partition member 16.

As a result of this structure, when the wristwatch case 1 receives shock from the watch crystal 2 side, this shock from the watch crystal 2 side is absorbed by the upper buffer members 7, and the watch module 4 is favorably protected thereby.

In the above-described embodiment, the side buffer members 5 are each formed by the disk-shaped first buffer layer 21 and the second buffer layer 22 having the plurality of dome-shaped projecting sections 22a and 22b being layered. However, the present invention is not limited thereto, and the side buffer members may be formed like side buffer members 25 to 30 in the first to sixth variation examples respectively shown in FIG. 6A to FIG. 6F.

Figure 6A:
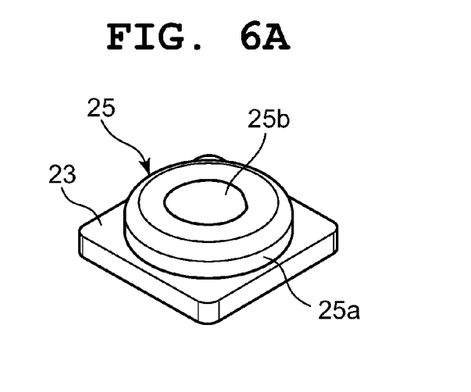
FIG. 6A is an enlarged perspective view of a first variation example of the side buffer member shown in FIG. 5A.

Specifically, the side buffer member 25 of the first variation example in FIG. 6A has a structure where a disk-shaped first buffer layer 25a and a second buffer layer 25b are layered, in which the second buffer layer 25b is a single dome-shaped projecting section arranged on the first buffer layer 25a.

In this side buffer member 25 as well, low-frequency vibration and high-frequency vibration can be attenuated and absorbed by the first buffer layer 25a and the second buffer layer 25b, as in the case of the above-described embodiment.

The side buffer member 26 of the second variation example in FIG. 6 has a structure where a disk-shaped first buffer layer 26a and a second buffer layer 26b are layered, in which the second buffer layer 26b has a disk shape whose diameter is smaller than that of the first buffer layer 26a.

Figure 6B:
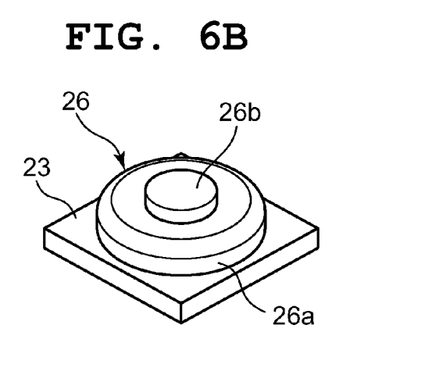
FIG. 6B is an enlarged perspective view of a second variation example of the side buffer member shown in FIG. 5A.

In this side buffer member 26 as well, low-frequency vibration and high-frequency vibration can be attenuated and absorbed by the first buffer layer 26a and the second buffer layer 26b, as in the case of the above-described embodiment.

Figure 6C:
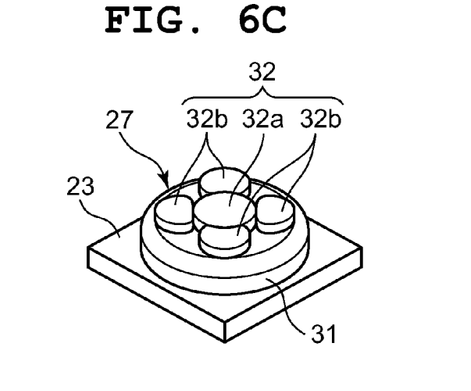
FIG. 6C is an enlarged perspective view of a third variation example of the side buffer member shown in FIG. 5A.

The side buffer member 27 of the third variation example in FIG. 6C has a structure where a disk-shaped first buffer layer 31 and a second buffer layer 32 are layered, in which the second buffer layer 32 includes a plurality of projecting sections 32a and 32b arrayed on the first buffer layer 31.

In this example, the first projecting section 32a of the second buffer layer 32 has a disk shape, and is formed on the center of the first buffer layer 31.

The plurality of second projecting sections 32b each have a disk shape whose size is smaller than that of the first projecting section 32a, and are arrayed around the first projecting section 32a.

In this side buffer member 27 as well, low-frequency vibration and high-frequency vibration can be attenuated and absorbed by the first buffer layer 31 and the second buffer layer 32, as in the case of the above-described embodiment.

Figure 6D:
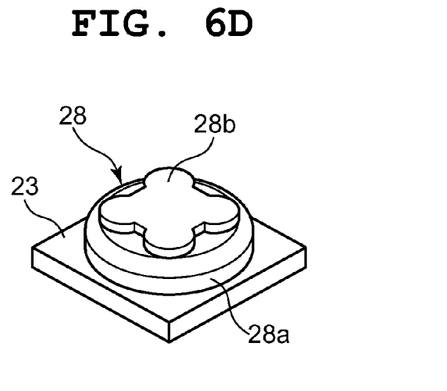
FIG. 6D is an enlarged perspective view of a fourth variation example of the side buffer member shown in FIG. 5A.

The side buffer member 28 of the fourth variation example in FIG. 6D has a structure where a disk-shaped first buffer layer 28a and a second buffer layer 28b are layered, in which the second buffer layer 28b has a substantially cross shape whose diameter is smaller than that of the first buffer layer 28a.

In this side buffer member 28 as well, low-frequency vibration and high-frequency vibration can be attenuated and absorbed by the first buffer layer 28a and the second buffer layer 28b, as in the case of the above-described embodiment.

Figure 6E:
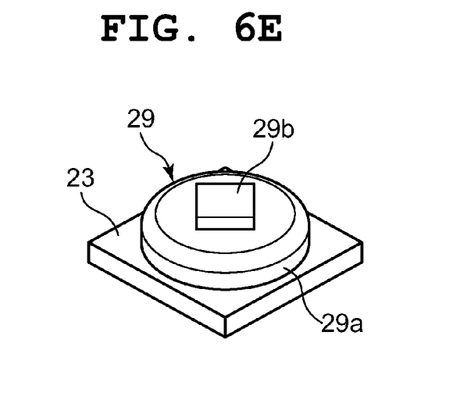
FIG. 6E is an enlarged perspective view of a fifth variation example of the side buffer member shown in FIG. 5A.

The side buffer member 29 of the fifth variation example in FIG. 6E has a structure where a disk-shaped first buffer layer 29a and a second buffer layer 29b are layered, in which the second buffer layer 29b has a rectangular plate shape whose size is smaller than that of the first buffer layer 29a.

In this side buffer member 29 as well , low-frequency vibration and high-frequency vibration can be attenuated and absorbed by the first buffer layer 29a and the second buffer layer 29b, as in the case of the above-described embodiment.

Figure 6F:
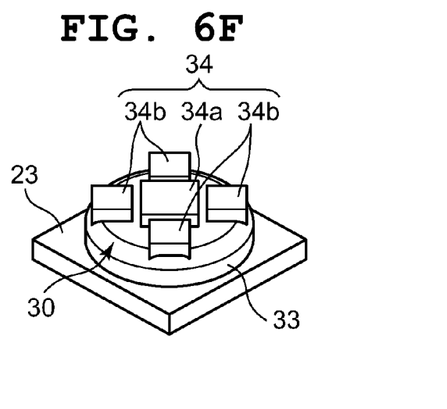
FIG. 6F is an enlarged perspective view of a sixth variation example of the side buffer member shown in FIG. 5A.

The side buffer member 30 of the sixth variation example in FIG. 6F has a structure where a disk-shaped first buffer layer 33 and a second buffer layer 34 are layered, in which the second buffer layer 34 includes a plurality of projecting sections 34a and 34b arrayed on the first buffer layer 33.

In this example, the first projecting section 34a of the second buffer layer 34 has a rectangular plate shape, and is formed on the center of the first buffer layer 33.

The plurality of second projecting sections 34b each have a rectangular plate shape whose size is smaller than that of the first projecting section 34a, and arrayed around the first projecting section 34a.

In this side buffer member 30 as well, low-frequency vibration and high-frequency vibration can be attenuated and absorbed by the first buffer layer 33 and the second buffer layer 34, as in the case of the above-described embodiment.

Also, in the above-described embodiment and the variation examples, the respective first buffer layers 21, 25a, 26a, 28a, 29a, 31, and 33 of the side buffer members 5 and 25 to 30 have a disk shape. However, the present invention is not limited thereto, and they may be formed in a rectangular plate shape, a polygonal plate shape such as a triangular or a pentagonal plate shape, or an elliptical plate shape.

Moreover, in the above-described embodiment, the side buffer members 5 are formed in each of which the disk-shaped first buffer layer 21 and the second buffer layer 22 having the plurality of dome-shaped projecting sections 22a and 22b are layered. However, the present invention is not limited thereto, and the side buffer members 5 may each be formed like a side buffer member 35 in a seventh variation example shown in FIG. 7A, or a side buffer member 36 in an eighth variation example shown in FIG. 7B.

Figure 7A:
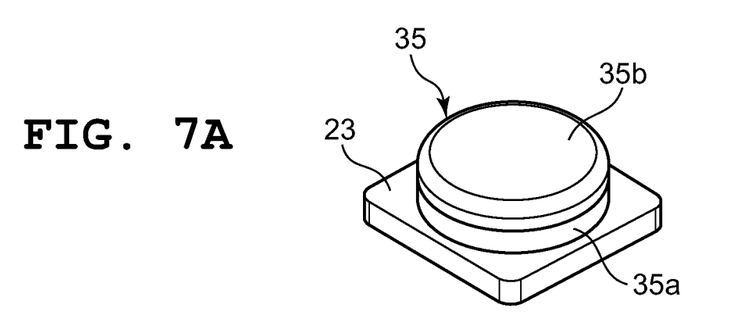
FIG. 7A is an enlarged perspective view of a seventh variation example of the side buffer member shown in FIG. 5A.

Specifically, the side buffer member 35 of the seventh variation example in FIG. 7A has a structure where a first buffer layer 35a and a second buffer layer 35b are layered, in which the first buffer layer 35a has low transmissibility of low-frequency vibration, and the second buffer layer 35b has low transmissibility of high-frequency vibration.

In this example, the first buffer layer 35a is composed of silicone gel having a high degree of hardness, and the second buffer layer 35b is composed of silicone gel whose hardness is lower than that of the first buffer layer 35a.

In this side buffer member 35 as well, low-frequency vibration and high-frequency vibration can be favorably and reliably attenuated and absorbed by the first buffer layer 35a and the second buffer layer 35b, as in the case of the above-described embodiment.

Figure 7B:
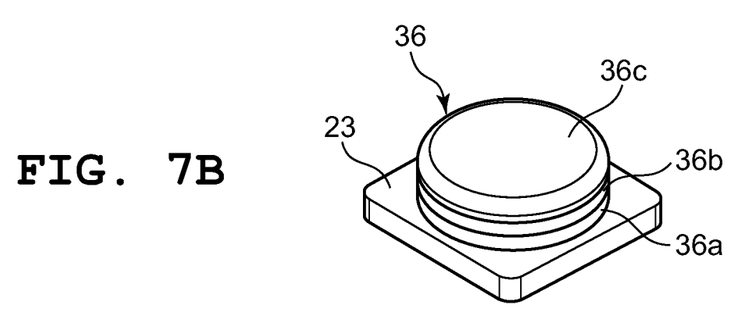
FIG. 7B is an enlarged perspective view of an eighth variation example of the side buffer member shown in FIG. 5A.

Also, the side buffer member 36 of the eighth variation example in FIG. 7B has a structure where a first buffer layer 36a, a second buffer layer 36b, and a third buffer layer 36c are layered, in which the first buffer layer 36a has low transmissibility of low-frequency vibration, the second buffer layer 65b has low transmissibility of intermediate-frequency vibration, and the third buffer layer 36c has low transmissibility of high-frequency vibration.

In this example, the first buffer layer 36a is composed of silicone gel having a high degree of hardness, and the second buffer layer 36b is composed of silicone gel whose hardness is lower than that of the first buffer layer 36a. The third buffer layer 36c is composed of silicone gel whose hardness is lower than that of the second buffer layer 36b.

In this side buffer member 36, low-frequency vibration to high-frequency vibration can be favorably and reliably attenuated and absorbed by the first buffer layer 36a, the second buffer layer 36b, and the third buffer layer 36c. Therefore, vibration from shock can be more favorably and reliably attenuated and absorbed, as compared to the above-described embodiment.

Lastly, although the present invention has been applied to a wristwatch in the above-described embodiment and the variation examples, it is not necessarily required to be applied to a wristwatch, and may be applied to various timepieces, such as travel clocks, alarm clocks mantelpiece clocks, and wall clocks In addition, the present invention is not necessarily required to be applied to a timepiece, and may be widely applied to electronic devices, such as mobile phones and mobile information terminals.

While the present invention has been described with reference to the preferred embodiments, it is intended that the invention be not limited by any of the details of the description therein but includes all the embodiments which fall within the scope of the appended claims.

What is claimed is:

1. A shock buffering structure, comprising:
   a buffer member which is arranged between a device case and a module arranged within the device case;
   wherein the buffer member is layered and comprises a first buffer layer and a second buffer layer mounted directly on the first buffer layer, wherein the first buffer layer and the second buffer layer have respective different vibration transmissibilities for predetermined frequencies; and
   wherein the second buffer layer comprises a first projecting section provided at a center of the first buffer layer and a plurality of second projecting sections provided around the first projecting section; wherein a plurality of the buffer members are provided, the buffer members being arranged between an outer peripheral surface of the module and an inner peripheral surface of the device case opposing the module; and wherein the buffer members protect against shocks perpendicular to a main face of the structure.

2. The shock buffering structure according to claim 1, wherein the first buffer layer has low vibration transmissibility for low frequencies, and
   wherein the second buffer layer has low vibration transmissibility for frequencies higher than the low frequencies.

3. The shock buffering structure according to claim 2, wherein the first buffer layer is formed in a plate shape having a predetermined thickness.

4. The shock buffering structure according to claim 3, wherein the first buffer layer is formed in a short columnar-plate shape and the first projecting section and the plurality of second projecting sections of the second buffer layer are each formed in a dome shape.

5. The shock buffering structure according to claim 2, wherein the first buffer layer is composed of silicone gel having a high degree of hardness, and
   wherein the second buffer layer is composed of silicone gel having a hardness lower than the hardness of the first buffer layer.

6. The shock buffering structure according to claim 2, wherein a plurality of the buffer members are provided, the buffer members being arranged on a continuous sheet having elasticity.

7. The shock buffering structure according to claim 2, wherein the device case further comprises:
   a plurality of push-button switches for operating the module; and
   push-button switch receiving members which oppose respective ones of the plurality of push-button switches and which are arranged side-by-side with the buffer members; and
   wherein the push-button switch receiving members are of an equal height or a slightly lower height than a height of the buffer members.

8. The shock buffering structure according to claim 2, wherein a lower buffer member is arranged between a bottom surface of the module and an opposing bottom surface of the device case, and
   wherein an upper buffer member is arranged between a top surface of the module and an opposing top surface of the device case.

9. The shock buffering structure according to claim 1, wherein the first projecting section and the plurality of second projecting sections each project from an upper surface of the first buffer layer on which the second buffer layer is directly mounted.

10. An electronic device comprising:
    a device case;
    a module which is arranged within the device case; and
    a buffer member which is interposed between the device case and the module and which absorbs shock,
    wherein the buffer member is layered and comprises a first buffer layer and a second buffer layer mounted directly on the first buffer layer, wherein the first buffer layer and the second buffer layer have respective different vibration transmissibilities for predetermined frequencies; and
    wherein the second buffer layer comprises a first projecting section provided at a center of the first buffer layer and a plurality of second projecting sections provided around the first projecting section; wherein a plurality of the buffer members are provided, the buffer members being arranged between an outer peripheral surface of the module and an inner peripheral surface of the device case opposing the module; and wherein the buffer members protect against shocks perpendicular to a main face of the structure.

* * * * *

UNITED STATES PATENT AND TRADEMARK OFFICE
CERTIFICATE OF CORRECTION

PATENT NO.        : 9,462,716 B2
APPLICATION NO.   : 13/752950
DATED             : October 4, 2016
INVENTOR(S)       : Hiroyasu Kawaoka et al.

It is certified that error appears in the above-identified patent and that said Letters Patent is hereby corrected as shown below:

In the Claims

Column 12, Line 57, delete "structure" and insert --electronic device--.

Signed and Sealed this
Second Day of May, 2017

Michelle K. Lee
*Director of the United States Patent and Trademark Office*